United States Patent
Oyamada

(10) Patent No.: US 8,823,071 B2
(45) Date of Patent: Sep. 2, 2014

(54) ELECTRO-OPTICAL DEVICE AND ELECTRONIC APPARATUS

(75) Inventor: Shin Oyamada, Eniwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/603,541

(22) Filed: Sep. 5, 2012

(65) Prior Publication Data

US 2013/0075799 A1  Mar. 28, 2013

(30) Foreign Application Priority Data

Sep. 28, 2011  (JP) ................. 2011-212174

(51) Int. Cl.
*H01L 27/06* (2006.01)
*H01L 27/12* (2006.01)
*G02F 1/1362* (2006.01)

(52) U.S. Cl.
CPC ...... *H01L 27/1255* (2013.01); *G02F 1/136286* (2013.01); *G02F 1/136213* (2013.01); *G02F 2201/40* (2013.01)
USPC .............. 257/296; 257/59; 257/E27.016

(58) Field of Classification Search
USPC .............. 257/59, 296, E27.016, E27.121
See application file for complete search history.

(56) References Cited

U.S. PATENT DOCUMENTS

| | | |
|---|---|---|
| 2003/0155588 A1 | 8/2003 | Murade |
| 2007/0052890 A1 | 3/2007 | Sakai |
| 2010/0033645 A1 | 2/2010 | Nakagawa |
| 2010/0078666 A1* | 4/2010 | Mochiku ............... 257/98 |
| 2011/0241001 A1* | 10/2011 | Omoto ................ 257/59 |

FOREIGN PATENT DOCUMENTS

| | | |
|---|---|---|
| JP | 2003-308029 A | 10/2003 |
| JP | 2007-71936 A | 3/2007 |
| JP | 2008-46187 A | 2/2008 |
| JP | 2010-9070 A | 1/2010 |
| JP | 2010-39212 A | 2/2010 |

* cited by examiner

*Primary Examiner* — Mamadou Diallo
(74) *Attorney, Agent, or Firm* — ALG Intellectual Property, LLC

(57) ABSTRACT

Disclosed is a pixel electrode which is electrically connected to a scanning line electrically connected to a gate electrode, a data line electrically connected to a data line side source and drain region, and a pixel electrode side source and drain region; and a capacitance element which has a first capacitance electrode which is electrically connected to a capacitance line, a second capacitance electrode which is provided to oppose the first capacitance electrode, and a dielectric layer which is interposed between the first capacitance electrode and the second capacitance electrode, where the first capacitance electrode is arranged to be covered with the dielectric layer and the second capacitance electrode between a layer where the transistor, the scanning line, and the data line are provided and a layer where the pixel electrode is provided.

13 Claims, 10 Drawing Sheets

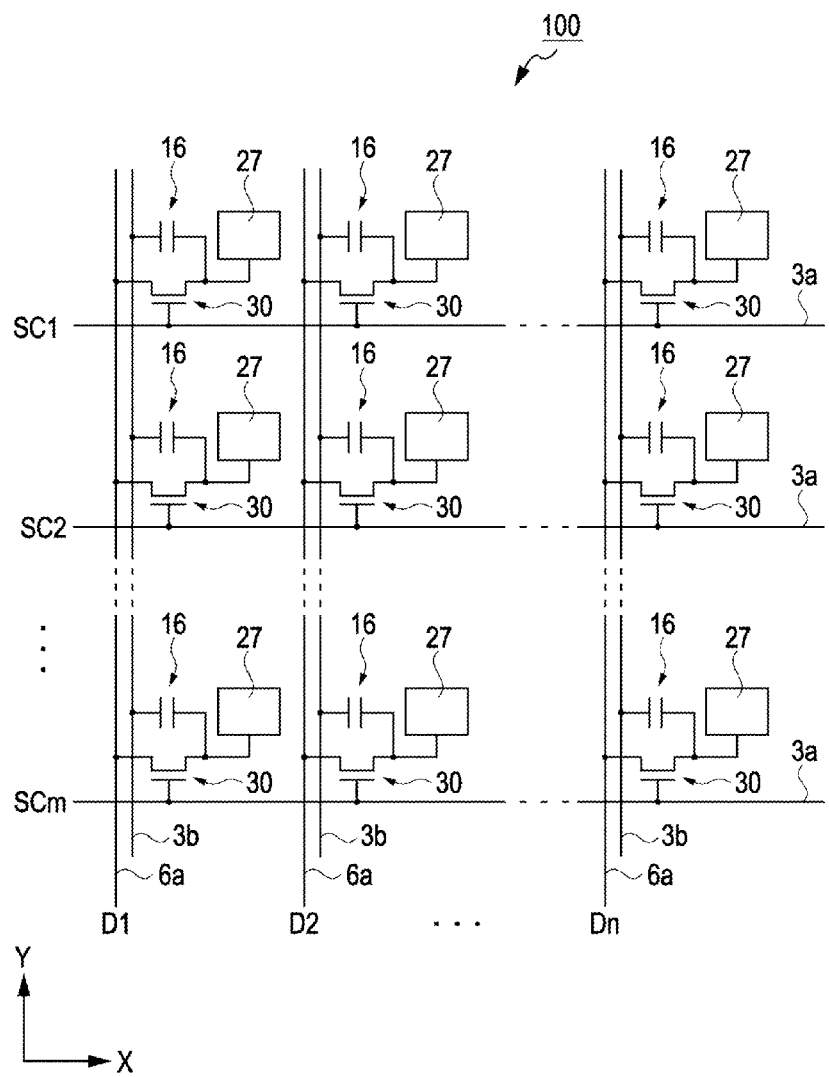

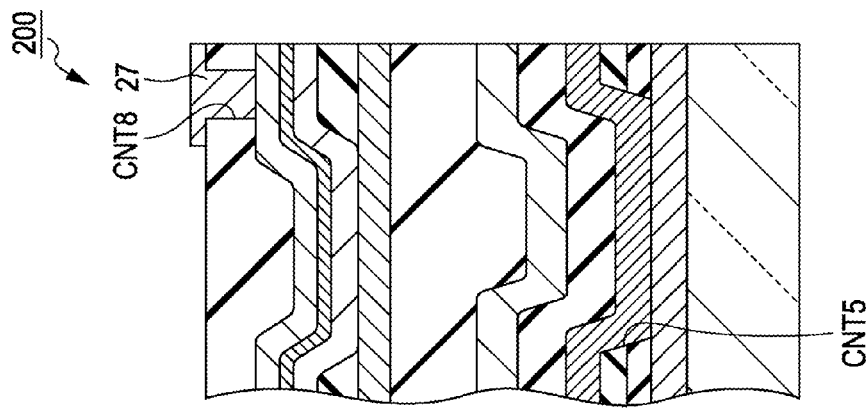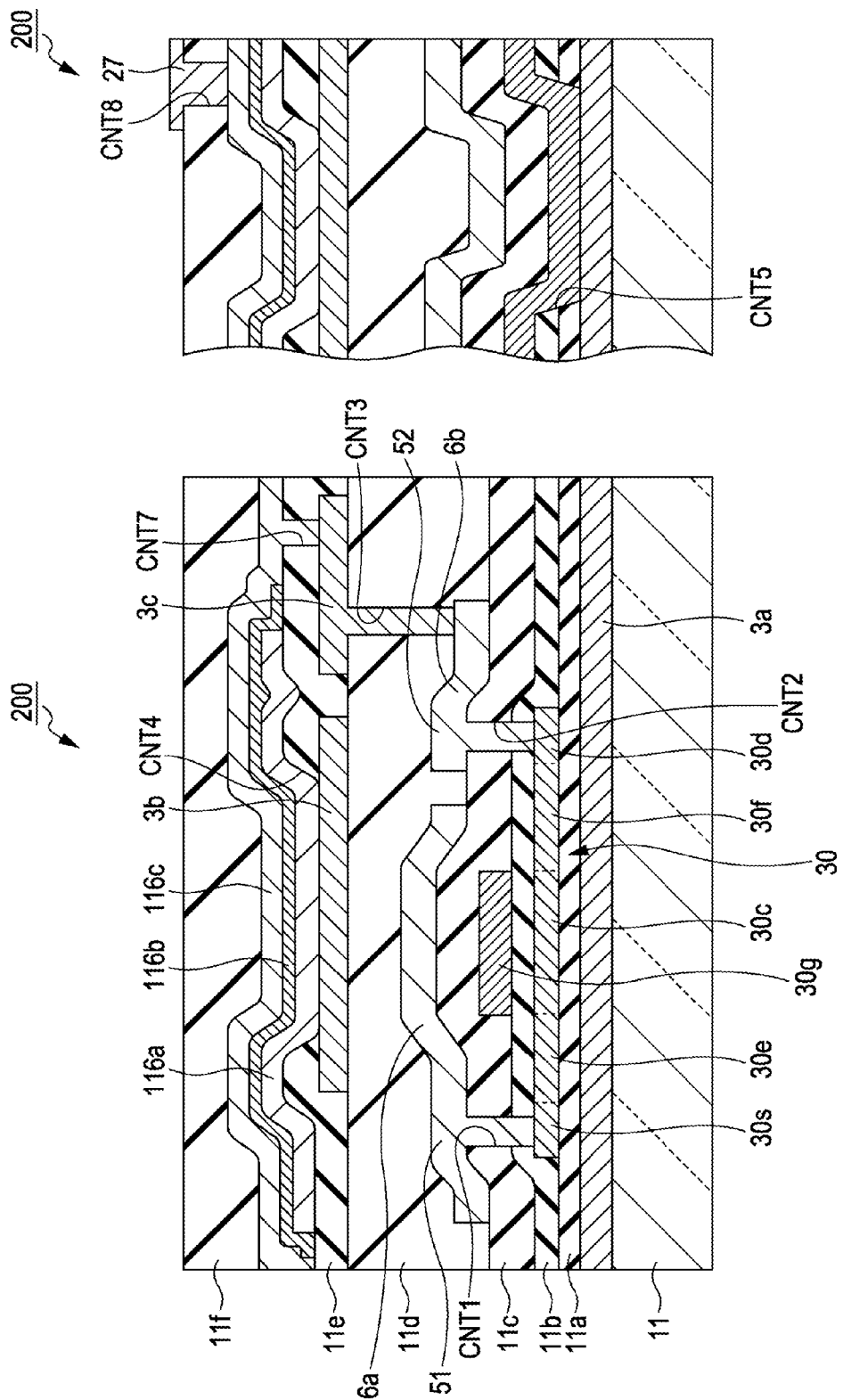

ELECTRO-OPTICAL DEVICE AND ELECTRONIC APPARATUS

BACKGROUND

1. Technical Field

The present invention relates to an electro-optical device and an electronic apparatus.

2. Related Art

As the electro-optical device, an active driven type liquid crystal device, where a switching element such as a thin film transistor is provided for each pixel, is known. The active driven type liquid crystal device has a liquid crystal layer between a pair of electrodes, and an image signal written into each pixel is temporarily held in an electric capacitance consisting of the pair of electrodes and the liquid crystal layer. In addition to this, a capacitance element, which electrically holds the image signal for a predetermined period, is provided for each pixel.

For example, in JP-A-2010-39212, providing a capacitance element by overlapping the position of relay wiring connected to a pixel electrode with a shield layer via a dielectric layer on the upper layer thereof is disclosed.

However, since a relay wiring which is connected to the pixel electrode via a contact hole is arranged in a lower layer than the shield layer, it is not possible for the relay wiring to be completely covered by the shield layer. In other words, in a case where the relay wiring is used as a capacitance wiring, there is a problem that the area of the capacitance wiring is not able to be effectively used.

SUMMARY

The invention can be realized as the following embodiments and application examples.

Application Example 1

According to Application Example 1, there is an electro-optical device including a transistor which has a gate electrode, a first source and drain region, and a second source and drain region; a pixel electrode which is electrically connected to a scanning line electrically connected to the gate electrode, a data line electrically connected to the first source and drain region, and the second source and drain region; and a capacitance element which has a first capacitance electrode which is electrically connected to a capacitance line, a second capacitance electrode which is provided to oppose the first capacitance electrode, and a dielectric layer which is interposed between the first capacitance electrode and the second capacitance electrode, wherein the first capacitance electrode is arranged to be covered with the dielectric layer and the second capacitance electrode between a layer where the transistor, the scanning line, and the data line are provided and a layer where the pixel electrode is provided.

According to this configuration, since the first capacitance electrode is arranged to be covered with the dielectric layer and the second capacitance electrode, it is possible to increase the area where the first capacitance electrode overlaps with the dielectric layer and the second capacitance electrode compared to a case where the dielectric layer and the second capacitance electrode are merely arranged on the first capacitance electrode such as in the related art. That is, it is possible to increase the area by using a side wall of the first capacitance electrode. As such, it is possible to increase the capacitance of the capacitance element to be greater than the related art. In addition, it is possible to effectively use the area of the capacitance electrodes.

Application Example 2

In the electro-optical device according to Application Example 1 described above, it is preferable that a first insulation film be formed between the second capacitance electrode and the pixel electrode, that the second capacitance electrode and the pixel electrode be electrically connected through a first contact hole which is provided in the first insulation film, and that the first contact hole be arranged at a position in which the first contact hole overlaps with the capacitance element in a planar view.

According to this configuration, since the first insulation film is provided between the pixel electrode connected to the second source and drain electrode and the second capacitance electrode, even if the pixel electrode and the second capacitance electrode are connected through the first contact hole, it is possible to position the second capacitance electrode so as to cover the first capacitance electrode. As such, it is possible to effectively use the area of the capacitance electrode and it is possible to increase the capacitance of the capacitance element without reducing the capacitance area of the capacitance element. Furthermore, it is possible to prevent the position of the first contact hole from being adversely affected.

Application Example 3

In the electro-optical device according to Application Example 1 described above, it is preferable that a second insulation film be provided between the first capacitance electrode and the capacitance line, that the first capacitance electrode and the capacitance line be connected through a second contact hole which is provided in the second insulation film, and that the second contact hole be formed in a size in which the second contact hole substantially overlaps with the first capacitance electrode in a planar view.

According to this configuration, due to the size of the second connection hole being set to be substantially the same as the first capacitance electrode (in other words, by being set to be larger than the other contact holes), it is possible to increase the area and thickness of the capacitance electrode and it is possible to increase the capacitance of the capacitance element.

Application Example 4

In the electro-optical device according to Application Example 1 described above, it is preferable that the first contact hole be arranged at a position in which the first contact hole does not overlap with the second contact hole in a planar view.

According to this configuration, since a position is provided where the position of the first contact hole does not overlap the second contact hole in a planar view, it is possible to perform connection of the second capacitance electrode and the pixel electrode in a more stable manner.

Application Example 5

In the electro-optical device according to Application Example 1 described above, it is preferable that the capacitance element be provided at an intersection portion of the scanning line and the data line in a planar view.

According to this configuration, since the capacitance element is provided in the intersection portion of the scanning line and the data line, by using a region of a non-open region, it is possible to provide a light blocking capacitance element, and it is possible to suppress a reduction in the aperture ratio.

Application Example 6

In the electro-optical device according to Application Example 1 described above, it is preferable that the capacitance element be provided in a position in which the capacitance element overlaps with the transistor in a planar view.

According to this configuration, since the capacitance element is provided in a region which overlaps with the transistor in a planar view, by using a region of a non-open region, it is possible to provide a light blocking capacitance element, and it is possible to suppress a reduction in the aperture ratio.

Application Example 7

According to Application Example 7, there is provided an electronic apparatus including the electro-optical device described above.

According to this configuration, since the electro-optical device described above is provided, it is possible to supply an electronic apparatus which is able to improve display quality.

BRIEF DESCRIPTION OF THE DRAWINGS

The invention will be described with reference to the accompanying drawings, wherein like numbers reference like elements.

FIG. 1A is a schematic planar view illustrating a configuration of the liquid crystal device and FIG. 1B is a schematic cross-sectional view along a line IB-IB of the liquid crystal device illustrated in FIG. 1A.

FIG. 2 is an equivalent circuit view illustrating an electrical configuration of the liquid crystal device.

FIG. 10 is a schematic cross-sectional view along a line X-X of the liquid crystal device of FIG. 9.

DESCRIPTION OF EXEMPLARY EMBODIMENTS

Below, a specific embodiment of the invention will be described according to the attached diagrams. Further, the used diagrams are shown as being appropriately magnified or reduced so as to be in a state where a portion which is being described is recognizable.

Here, in the following embodiment, for example, in a case where "on a substrate" is described, a case of being arranged so as to be in contact with the top of a substrate, a case of being arranged on a substrate with other constituent elements therebetween, or a case of a portion thereof being arranged to be in contact with the top of a substrate and another portion being arranged with other constituent elements therebetween are included.

In the present embodiment, an active matrix type liquid crystal device is exemplified as an example of an electro-optical device which is provided with a thin film transistor (TFT) as a pixel switching element. It is possible for this liquid crystal device to be appropriately used as, for example, an optical modulation element (liquid crystal light valve) of a projector type display device (liquid crystal projector) which will be described later.

First Embodiment

Configuration of Electro-Optical Device

Figure 1A:
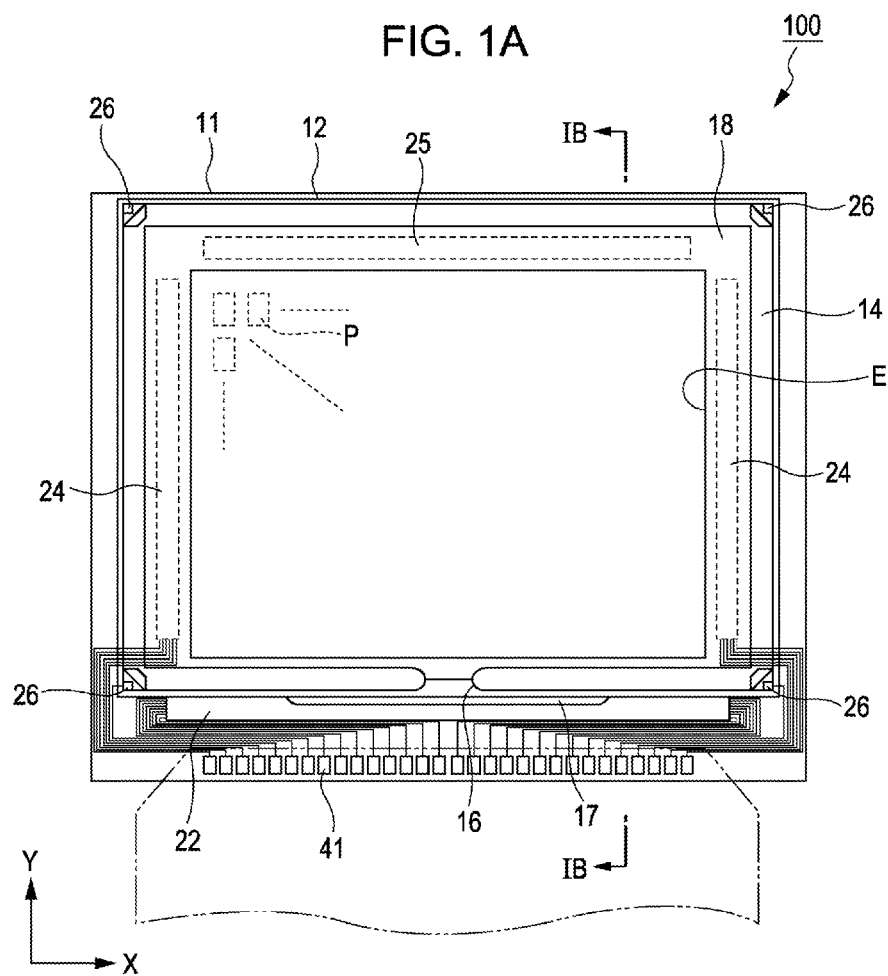
FIGS. 1A and 1B are schematic views illustrating a configuration of a liquid crystal device as an electro-optical device according to a first embodiment, where
Figure 1B:
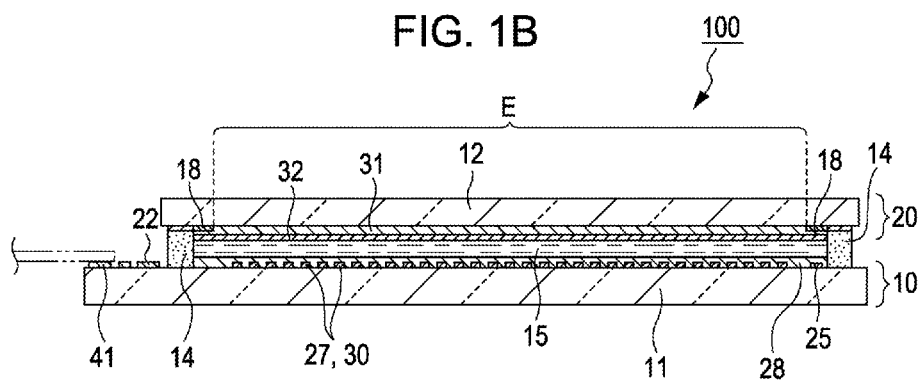

FIG. 1A is a schematic plan view illustrating a configuration of a liquid crystal device as an electro-optical device. FIG. 1B is a schematic cross-sectional view along a line IB-IB of the liquid crystal device illustrated in FIG. 1A. FIG. 2 is an equivalent circuit view illustrating an electrical configuration of the liquid crystal device. Below, a structure of the liquid crystal device will be described with reference to FIGS. 1A, 1B, and 2.

As illustrated in FIGS. 1A and 1B, a liquid crystal device 100 of the present embodiment has an element substrate 10 and an opposing substrate 20 which are arranged to oppose, and a liquid crystal layer 15 which is interposed between the pair of substrates. A first substrate 11 which is composed of the element substrate 10 and a second substrate 12 which is composed of the opposing substrate 20 use a transparent glass substrate such as, for example, quartz or the like.

The element substrate 10 is slightly larger than the opposing substrate 20, both substrates are connected by a sealing material 14 which is arranged in a frame shape, and the liquid crystal layer 15 is configured by enclosing liquid crystals which have positive or negative dielectric anisotropy in a gap. As the sealing material 14, for example, an adhesive such as epoxy resin which is thermoset or cured using ultraviolet is adopted. In the sealing material 14, spacers (not shown) are incorporated so that a space is constantly maintained between the pair of substrates.

In the inner side of the sealing material 14 which is arranged in a frame shape, a light blocking film 18 which has the same frame shape is provided. The light blocking film 18 consists of, for example, a light blocking metal or metallic oxide, and becomes a display region E where the inner side of the light blocking film 18 has a plurality of pixels P. Furthermore, although omitted in FIGS. 1A and 1B, a light blocking portion is provided so that the plurality of pixels P are partitioned in a planar manner in the display region E.

A data line driving circuit 22 is provided along the sealing member 14 which is along one side portion of the first substrate 11. In addition, a checking circuit 25 is provided at the inner side of the sealing material 14 along the other side portion which opposes the one side portion. Furthermore, scanning line driving circuits 24 are provided at the inner sides of the sealing material 14 along another two side portions which are orthogonal to the one side portion and oppose each other. At an inner side of the sealing material 14 at the other side portion which opposes the one side portion, a plurality of wirings (not shown) are provided which link the two scanning line driving circuits 24.

The wirings which link the data line driving circuit 22 and the scanning line driving circuits 24 are connected to a plurality of external connection terminals 41 which are lined up along the one side portion. Hereinafter, there is description where the direction along the one side portion is set as the X direction and the direction along the two other side portions which are orthogonal to the one side portion and oppose each other are set as the Y direction. Here, the arrangement of the checking circuit 25 is not limited to this and may be provided at a position along the inner side of the sealing material 14 between the data line driving circuit 22 and the display region E.

As shown in FIG. 1B, on the surface on the liquid crystal layer 15 side of the first substrate 11, a pixel electrode 27 with optical transparency and a thin film transistor 30 (abbreviated below to "TFT 30") as a switching element which are provided for each pixel P, a signal line, and an orientation film 28, which covers the pixel electrode 27 and the thin film transistor 30, are formed. In addition, a light blocking structure is adopted where the switching action becomes unstable due to light being irradiated onto a semiconductor layer in the TFT 30.

On the surface on the liquid crystal layer 15 side of the second substrate 12, a light blocking film 18, an interlayer film layer (not shown) which is deposited to cover this, a common electrode 31 which is provided so as to cover the interlayer film layer, and an orientation film 32 which covers the common electrode 31 are provided.

The light blocking film 18 is provided in a frame shape in a position which overlaps with the scanning line driving circuits 24 and the checking circuit 25 in a planar view as shown in FIG. 1A. Due to this, a function is accomplished in which erroneous actions due to light from a peripheral circuit which includes these driving circuits by the light which is incident from the opposing substrate 20 side being blocked. In addition, high contrast in the display in the display region is secured by unnecessary stray light being blocked so as to not be irradiated onto the display region E.

The interlayer film layer is formed from, for example, an inorganic material such as silicon oxide and is provided so as to have optical transparency and cover the light blocking film 18. As a method for forming such an interlayer film layer, for example, there are the examples of a method of depositing using a plasma CVD method or the like.

The common electrode 31 is formed from, for example, a transparent conductive film such as ITO (Indium Tin Oxide) and is electrically connected to the wiring on the element substrate 10 side using a vertical connection portion 26 which is provided in the four corners of the opposing substrate 20 as shown in FIG. 1A.

The orientation film 28 which covers the pixel electrode 27 and the orientation film 32 which covers the common electrode 31 are selected based on the optical design of the liquid crystal device 100. For example, there are the examples of an orientation film where substantially horizontal orientation processing is carried out with regard to the liquid crystals due to an organic material such as polyimide being deposited and the surface thereof being wrapped and an orientation film which is substantially vertically oriented with regard to the liquid crystals by an inorganic material such as SiOx (silicon oxide) being deposited using a gas phase growth method.

As shown in FIG. 2, the liquid crystal device 100 has a plurality of scanning lines 3a and a plurality of data lines 6a which are orthogonal and insulated from each other at least in the display region E and a capacitance line 3b which is arranged in parallel along the data lines 6a. The X direction is a direction in which the scanning line 3a is extended, and the Y direction is the direction in which the data line 6a is extended.

The scanning lines 3a, the data lines 6a, and the capacitance line 3b, and the pixel electrode 27, the TFT 30, and the capacitance element 16 are provided in a region which is partitioned by these signal lines and thereby configuring the pixel circuit of the pixel P.

The scanning lines 3a are electrically connected to the gate of the TFT 30 and the data lines 6a are electrically connected to the source and drain regions on the data line side as the first source and drain region of the TFT 30. The pixel electrode 27 is electrically connected to the source and drain regions on the pixel electrode side as the second source and drain region of the TFT 30.

The data line 6a is connected to the data line driving circuit 22 (refer to FIGS. 1A and 1B). A semiconductor integrated circuit or a control section which is connected to the plurality of external connection terminals 41 supplies image signals D1, D2, . . . , Dn to a portion of the terminals out of the external connection terminals 41. The image signals D1, D2, . . . , Dn which are supplied to a portion of the terminals are supplied to the data lines 6a via the data line driving circuit 22. The scanning lines 3a are connected to the scanning line driving circuit 24 (refer to FIGS. 1A and 1B) and scanning signals SC1, SC2, . . . , SCm which are supplied from the scanning line driving circuit 24 are supplied to each of the pixels P. The image signals D1, D2, . . . , Dn which are supplied to the data lines 6a are supplied to the pixels P according to the scanning signals SC1, SC2, . . . , SCm which are supplied from the scanning line driving circuit 24.

The image signals D1 to Dn which are supplied from the data line driving circuit 22 to the data lines 6a may be supplied sequentially by lines in this order or may be supplied in groups with regard a plurality of the data lines 6a which are adjacent to each other. The data line driving circuit 22 controls the timing with which the image signals D1 to Dn are supplied to the data lines 6a. The scanning line driving circuit 24 supplies the scanning signals SC1 to SCn with regard to the scanning lines 3a sequentially by line in pulses at a predetermined timing.

The liquid crystal device 100 is configured so that the image signals D1 to Dn which are supplied from the data lines 6a are written into the pixel electrode 27 at a predetermine timing by being in an ON state for only a certain period due to the input of the scanning signals SC1 to SCm to the TFT 30 which is a switching element. Then, the image signals D1 to Dn with predetermined levels, which are written into the liquid crystal layer 15 via the pixel electrode 27, are held for a certain period between the pixel electrode 27 and the common electrode 31 which is arranged to oppose via the liquid crystal layer 15.

Since the image signals D1 to Dn which are held are prevented from leaking, the capacitance element 16 is connected in series with the liquid crystal capacitance which is formed between the pixel electrode 27 and the common electrode 31. The capacitance element 16 is electrically connected with the drain of the TFT 30 and the capacitance line 3b. The capacitance element 16 has a dielectric layer 16b between a first capacitance electrode 16a which blocks light and a second capacitance electrode 16c.

In this manner, the liquid crystal device 100 which is transparent and adopts an optical design of a normally white mode is a bright display when the pixel P is not driven and a normally black mode which is a dark display when not driven.

Polarizing elements are used in each of the incident side and the emission side of the light by being arranged according to the optical design.

Figure 3:
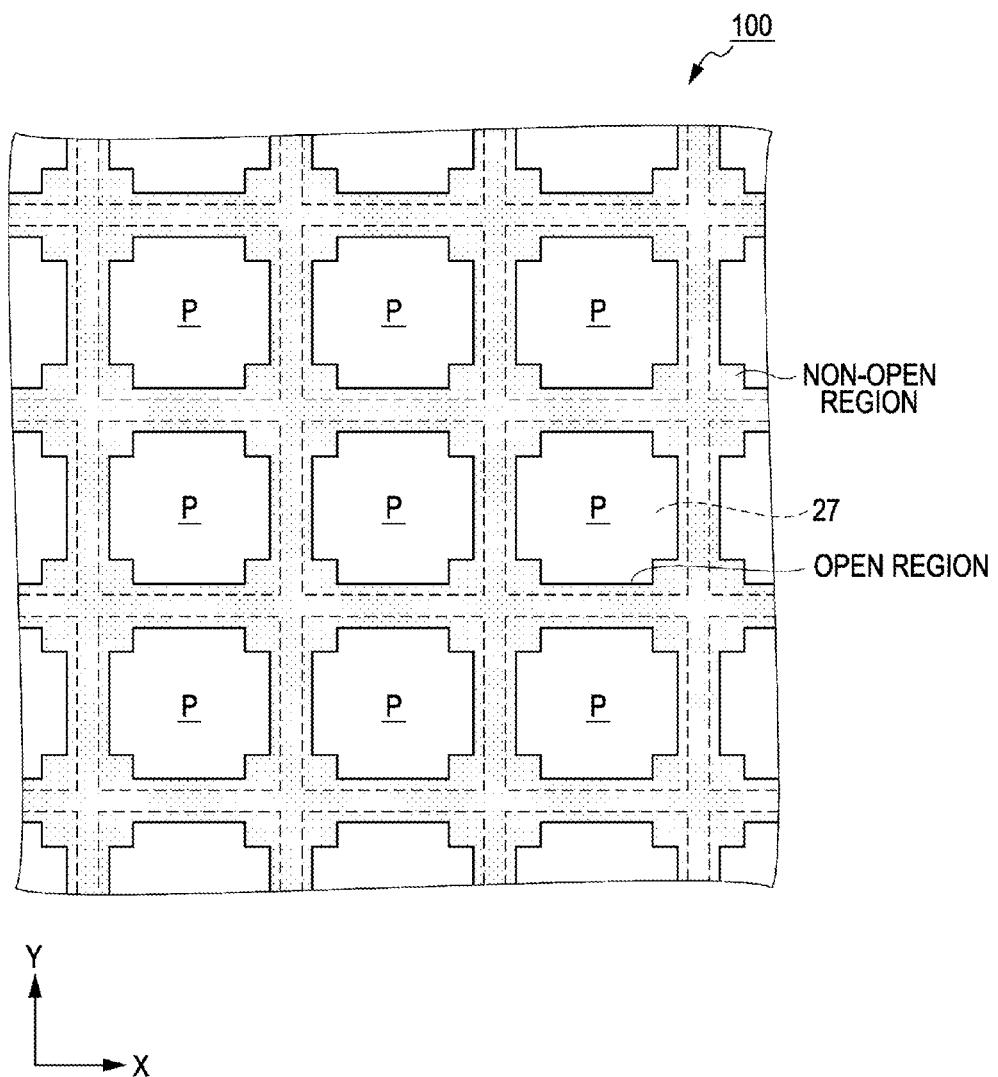
FIG. 3 is a schematic plan view illustrating an arrangement of a pixel in the liquid crystal device.
Figure 4:
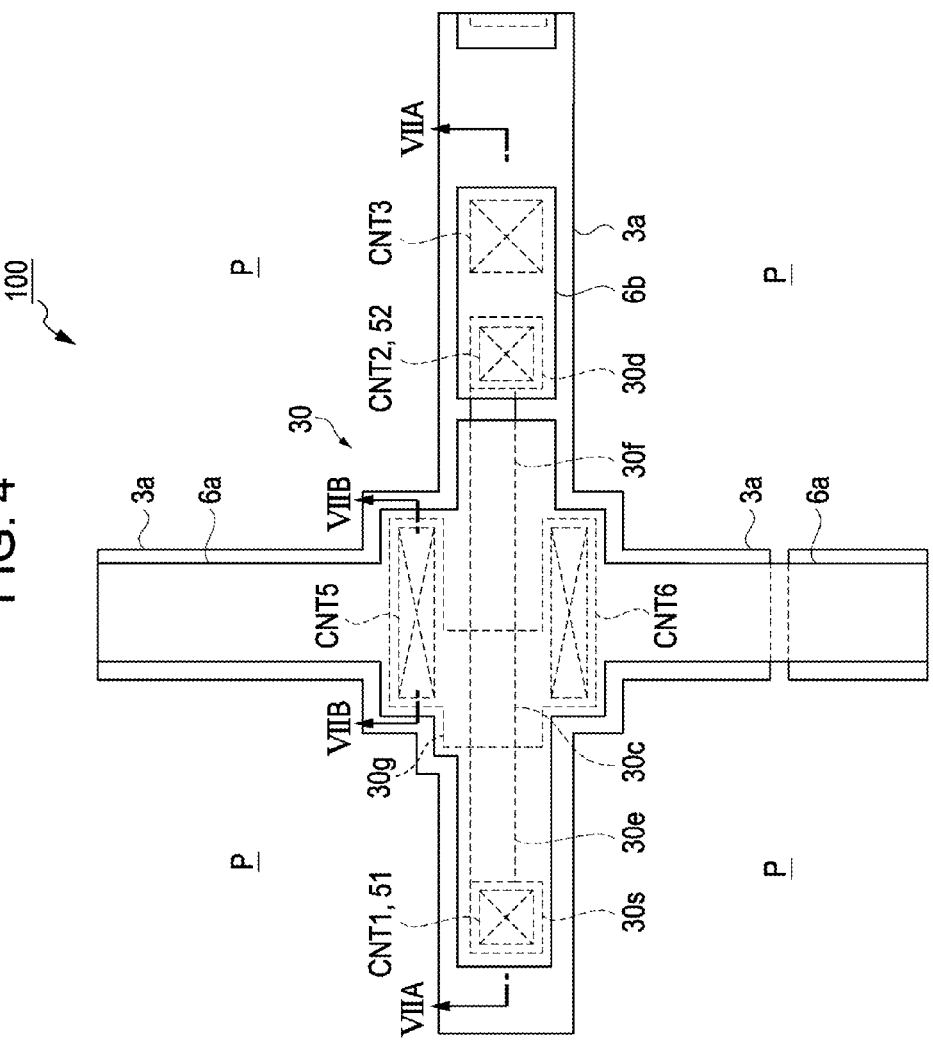
FIG. 4 is a schematic plan view illustrating a configuration of a pixel in the liquid crystal device.
Figure 5:
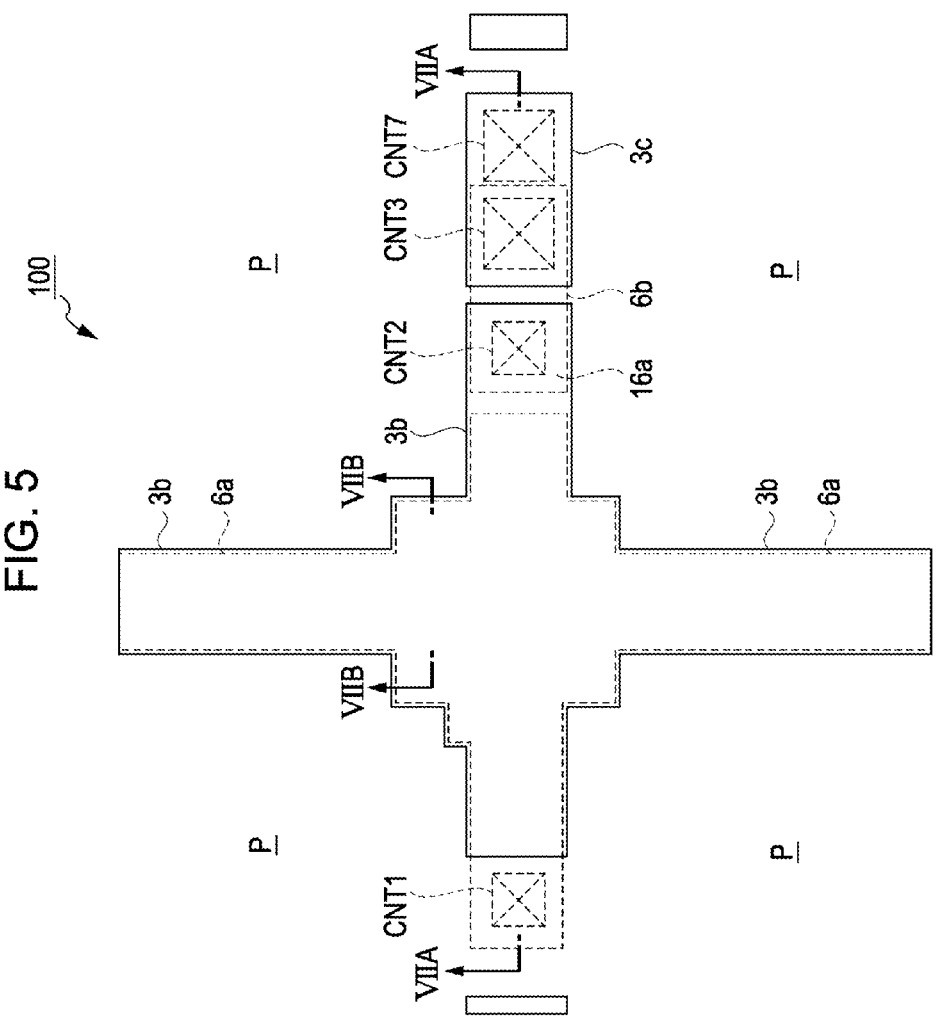
FIG. 5 is a schematic plan view illustrating a configuration of a pixel in the liquid crystal device.
Figure 6:
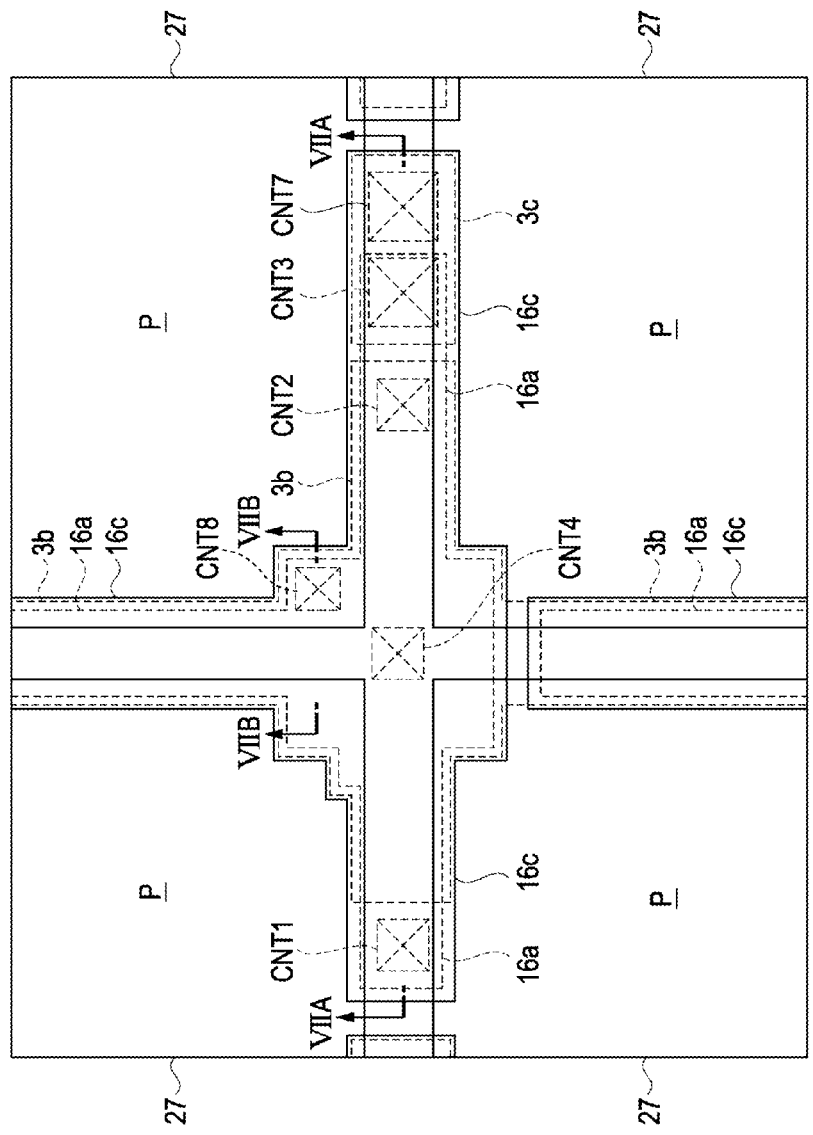
FIG. 6 is a schematic plan view illustrating a configuration of a pixel in the liquid crystal device.
Figure 7:
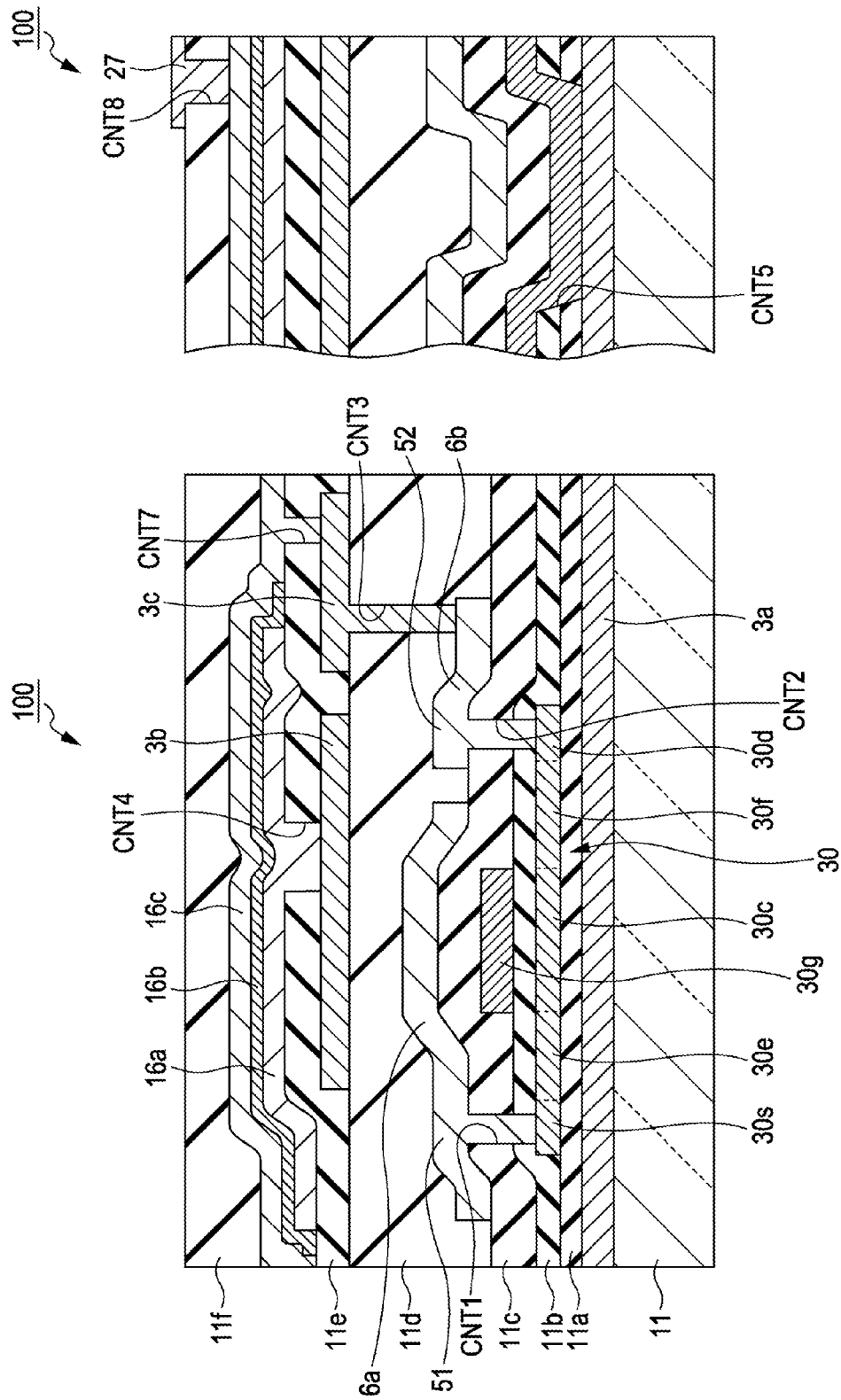
FIG. 7 is a schematic cross-sectional view along a line VII-VII of the pixel illustrated in FIGS. 4 to 6.

FIG. 3 is a schematic plan view illustrating an arrangement of a pixel in the liquid crystal device. FIGS. 4 to 6 are schematic plan views illustrating a configuration of a pixel in the liquid crystal device. FIG. 7 is a schematic cross-sectional view along a line VII-VII of the pixel illustrated in FIGS. 4 to 6. Below, the planar configuration and the cross-sectional configuration of the pixel will be described with reference to FIGS. 3 to 7.

As shown in FIG. 3, the pixel P in the liquid crystal device 100 has an open region with substantially a planar square shape. The open region is encompassed by a non-open region which blocks light and is provided in a grid formation which extends in the X direction and the Y direction.

The scanning line 3a as shown in FIG. 2 is provided in the non-open region which extends in the X direction. The scanning lines 3a use a conductive material which blocks light and at least a portion of a non-open region is configured by the scanning line 3a.

In the same manner, the data lines 6a and the capacitance line 3b as shown in FIG. 2 are provided in the non-open region which extends in the Y direction. The data lines 6a and the capacitance lines 3b also use a conductive material which blocks light and at least a portion of a non-open region is configured by the data lines 6a and the capacitance lines 3b.

The non-open region is not only configured by the signal lines which are provided at the element substrate 10 side but is able to also be configured using the light blocking film 18 (refer to FIGS. 1A and 1B) which is patterned into a grid formation in the opposing substrate 20 side.

The TFT 30 and the capacitance element 16 as shown in FIG. 2 are provided in the vicinity of the intersection portions of the non-open region. Due to the TFT 30 being provided in the vicinity of the intersection portions of the non-open region which blocks light, optically erroneous actions of the TFT 30 are prevented and the aperture ratio of the open region is secured. The detailed configuration of the pixel P will be described later, but the width of the non-open section in the vicinity of the intersection portion is widened compared to other portions in relation to the providing of the TFT 30 and the capacitance element 16 in the vicinity of the intersection portion.

FIG. 4 shows a planar configuration from the layer where the scanning line 3a is provided to the layer where the data line 6a is provided on the first substrate 11. FIG. 5 shows a planar configuration from the layer where the data line 6a is provided to the layer where the capacitance line 3b is provided. FIG. 6 shows a planar configuration from the layer where the capacitance line 3b is provided to the layer where the image electrode 27 is provided.

As shown in FIG. 4, the pixel P has the TFT 30 which is provided at the intersection portion of the scanning line 3a and the data line 6a. The TFT 30 has a semiconductor layer 30a with an LDD (Lightly Doped Drain) structure which has a data line side source and drain region 30s, a pixel electrode side source and drain region 30d, a channel region 30c, a jointing region 30e which is provided between the data line side source and drain region 30s and the channel region 30c, and a joining region 30f which is provided between the channel region 30c and the pixel electrode side source and drain region 30d. The semiconductor layer 30a is arranged so as to overlap with the scanning line 3a by pass through the intersection section. In addition, as shown in FIG. 4, the semiconductor layer 30a extends in the X direction.

The scanning line 3a has an extension section which extends in the X and Y directions in the intersection portion with the data line 6a and the width of the scanning line 3a is widened in the extension section compared to other portions. In addition, in other words, the planar shape of the extension section is a square. A gate electrode 30g with a curved shape which has an open section which overlaps with the extension section in a planar manner and which does not overlap with the joining region 30f and the pixel electrode side source and drain region 30d.

In the gate electrode 30g, a portion which extends in the Y direction overlaps with the channel regions 30 in a planar manner. In addition, the gate electrode 30g is curved from the portion which overlaps with the channel region 30c and extends in the X direction. The gates electrode is electrically connected with the scanning lines 3a via holes CNT5 and CNT6 where the portions opposing each are provided between the extension section of each of the scanning lines 3a. In addition, as shown in FIG. 4, a portion, which opposes the channel region 30c, in the gate electrode 30g is arranged to be shifted to the left side from the position in the X direction of the contact holes CNT5 and CNT6.

The contact holes CNT5 and CNT6 are rectangular shapes (rectangles) which are long in the X direction in a planar view and are provided on both sides so as to interpose the joining region 30f along the channel region 30c and the joining region 30f of the semiconductor layer 30a.

The data line 6a extends in the Y direction, has an extension section which is the same as the intersection portion with the scanning line 3a, and the width of the data line 6a in the extension section is widened compared to the other portions. There is electrical connection with the data line side source and drain region 30s using a contact hole CNT1 which is provided in a portion which protrudes from the extension section in the X direction. The portion which includes the contact hole CNT1 becomes a data line side source and drain electrode 51. The scanning line 3a is provided so that the portion, which protrudes in the X direction, of the data line 6a and the contact hole CNT1 overlap in a planar manner.

On the other hand, a contact hole CNT2 is provided in a portion (edge portion) of the pixel electrode side source and drain region 30d and the portion which includes the contact hole CNT2 becomes a pixel electrode side source and drain electrode 52 (refer to FIGS. 4 and 5). The contact hole CNT2 is electrically connected to a contact hole CNT3 via a relay electrode 6b (refer to FIGS. 4 and 5). Here, the portion, which protrudes to the left and right in the X direction, of the data lines 6a is arranged so that there is a gap with the pixel electrode side source and drain electrode 52 and is provided so as to cover the semiconductor layer 30a.

As shown in FIG. 5, the capacitance line 3b extends in the Y direction and the capacitance line 3b is provided so as to overlap with a portion of the data lines 6a and a portion of the scanning line 3a in a planar manner. The capacitance line 3b has an extension section in the intersection portion with the scanning line 3a and the width of the capacitance line 3b in the extension section is widened compared to the other portions. The capacitance line 3b and the first capacitance electrode 16a are electrically connected via a contact hole CNT4 as the second contact hole CNT2.

In addition, the contact hole CNT4 is provided in the extension section of the capacitance line 3b. Furthermore, the capacitance line 3b has a portion which protrudes from the extension section in the X direction and is arranged so as to overlap with the semiconductor layer 30a. In addition, it is preferable that the protruding portion of the capacitance line 3b is provided so as to overlap with the contact hole CNT1 or the contact hole CNT2.

The capacitance element 16 is arranged in the non-open region (refer to FIG. 3) and the first capacitance electrode, the dielectric layer 16b, and the second capacitance electrode 16c which have island shapes are laminated in order from the first substrate 11 side. The dielectric layer 16b is formed so as to cover the first capacitance electrode 16a. Furthermore, the second capacitance electrode 16c is formed so as to cover the first capacitance electrode 16a and the dielectric layer 16b.

Furthermore, as shown in FIG. 6, the first capacitance electrode 16a which configures the capacitance element 16 is provided in an island shape so as to overlap with a portion of the capacitance line 3b. The first capacitance electrode 16a has an extension section so as to overlap with the extension section of the capacitance line 3b. Then, the first capacitance electrode 16a has a first portion which protrudes from the extension section to the left side in the X direction, a second portion which protrudes to the right side in the X direction, and a third portion which protrudes to the upper side in the Y direction.

It is preferable that the first portion of the first capacitance electrode 16a be provided so as to overlap with the joining region 30e of the semiconductor layer 30a in a planar manner. It is preferable that the first portion of the first capacitance electrode 16a be provided so as to further overlap with the data line side source and drain region 30s and the contact hole CNT1 in a planar manner. It is preferable that the second portion of the first capacitance electrode 16a be provided so as to overlap with the joining region 30f of the semiconductor layer 30a in a planar manner. It is preferable that the second portion of the first capacitance electrode 16a be provided to further overlap with the pixel electrode side source and drain region 30d and the contact hole CNT2 in a planar manner. It is preferable that the second portion of the first capacitance electrode 16a be provided so as to overlap with the contact hole CNT3 in a planar manner. It is desirable for the third portion of the first capacitance electrode 16a to protrude to the upper side in FIG. 6 and not to protrude to the lower side. That is, it is preferable that the third portion of the first capacitance electrode 16a protrude in the Y direction between the pixel electrode 27 which is electrically connected to the TFT 30 and the adjacent pixel electrode 27 in the X direction. Furthermore, the width in the extension section of the first capacitance electrode 16a is wider in the Y direction than in the first portion and the second portion. In addition, the width in the extension section of the first capacitance electrode 16a is wider in the X direction than the third portion.

In addition, in a case where a predetermined constant potential is supplied to the capacitance line 3b, the capacitance line 3b and the first capacitance electrode 16a accomplish a role of reducing the cross talk between the second capacitance electrode 16c or the data lines 6a and the pixel electrode 27.

The second capacitance electrode 16c is provided in an island shape which is independent for each of the pixels P. The second capacitance electrode 16c has a shape which is the same as the first capacitance electrode 16a in a planar shape. The second capacitance electrode 16c has an extension section so as to overlap with the extension section of the capacitance line 3b. Then, the second capacitance electrode 16c has a first portion which protrudes from the extension section to the left side in the X direction, a second portion which protrudes to the right side in the X direction, and a third portion which protrudes to the upper side in the Y direction.

It is preferable that the first portion of the second capacitance electrode 16c be provided so as to overlap with the joining region 30e of the semiconductor layer 30a in a planar manner. It is preferable that the first portion of the second capacitance electrode 16c be provided so as to further overlap with the data line side source and drain region 30s and the contact hole CNT1 in a planar manner. It is preferable that the second portion of the second capacitance electrode 16c be provided so as to overlap with the joining region 30f of the semiconductor layer 30a in a planar manner. It is preferable that the second portion of the second capacitance electrode 16c be provided to further overlap with the pixel electrode side source and drain region 30d and the contact hole CNT2 in a planar manner. It is preferable that the second portion of the second capacitance electrode 16c be provided so as to overlap with the contact hole CNT3 in a planar manner. It is desirable for the third portion of the second capacitance electrode 16c to protrude to the upper side in FIG. 6 and not to protrude to the lower side. That is, it is preferable that the third portion of the second capacitance electrode 16c protrude in the Y direction between the pixel electrode 27 which is electrically connected to the TFT 30 and the adjacent pixel electrode 27 in the X direction. In particular, since the second capacitance electrode 16c is electrically connected to the pixel electrode 27, it is preferable since the third portion of the second capacitance electrode 16c becomes a potential which corresponds to the image signal which is supplied to the pixel electrode 27. Furthermore, the width in the extension section of the second capacitance electrode 16c is wider in the Y direction than the first portion and the second portion. In addition, the width in the extension section of the second capacitance electrode 16c is wider in the X direction than the third portion.

As above, the capacitance element 16 is provided in a region in which the first capacitance electrode 16a opposes the second capacitance electrode 16c via the dielectric layer 16b. Then, in the same manner as the first capacitance electrode 16a and the second capacitance electrode 16c, the capacitance element 16 has an extension section, a first portion which protrudes from the extension section to the left side in the X direction, a second portion which protrudes to the right side in the X direction, and a third portion which protrudes to the upper side in the Y direction.

The second capacitance electrode 16c of a certain pixel P and the second capacitance electrode 16c of the adjacent pixel P are arranged so as to encompass the one pixel and the non-open region which blocks light (refer to FIG. 3) is formed.

With the configuration as above, it is possible to increase the holding ability of the capacitance element since the capacitance element 16 is formed in a region which is as wide as possible. In addition, it is possible to increase the blocking of light with regard to the semiconductor layer 30a by the capacitance line 3b, the first capacitance electrode 16a and the second capacitance electrode 16c being configured with a material which blocks light and being formed so as to overlap with the semiconductor layer 30a in a planar manner.

In addition, the contact hole CNT4 as the second contact hole CNT2 overlaps with the first capacitance electrode 16a, the dielectric layer 16b, and the second capacitance electrode 16c in a planar manner, that is, is preferably provided in a position which overlaps with the capacitance element 16 in a planar manner, in particular, in a portion which overlaps with the first capacitance electrode 16a in a planar manner. Due to this, it is possible to secure the planar area of the capacitance element 16. In addition, since the contact hole CNT4 is able to be secured to be wide, it is possible to reliably perform the electric connection with the capacitance line 3b and the first capacitance electrode 16a. In addition, in other word, due to this, it is possible to improve the aperture ratio of the pixel P.

The contact hole CNT3 is electrically connected with a contact hole CNT7 via a relay electrode 3c with an island shape. The contact hole CNT7 is electrically connected with an edge portion of the second capacitance electrode 16c.

Furthermore, in the second capacitance electrode 16c, a contact hole CNT8 as the contact hole CNT1 is provided and there is an electrical connection with the pixel electrode 27 (P) via the contact hole CNT8. In other words, a portion of the second capacitance electrode 16c protrudes to a position which overlaps with the contact hole CNT8 and functions as a relay layer which is electrically connected with the contact hole CNT7 and the contact hole CNT8.

The pixel electrode 27 (P) is provided so that an outer edge portion overlaps with the scanning line 3a and the data line 6a, and is electrically connected to the pixel electrode side source and drain region 30d via the contact holes CNT2, CNT3, CNT7, and CNT8 which are provided in positions which overlap with the scanning line 3a in the present embodiment.

In addition, the contact hole CNT8 is provided in a region which is in the vicinity of the intersection portion of the non-open region of FIG. 3 and which is a region where the width of the non-open region is wider than the other portions and the pixel electrode 27 overlap. Then, the contact hole CNT8 is provided so as to overlap with the extension sections which are provided in the scanning line 3a, the data line 6a, and the capacitance line 3b.

In FIG. 6, the contact hole CNT8 is provided in a non-open region which corresponds to the lower left when viewed from the open region. The contact hole CNT8 overlaps with the first capacitance electrode 16a, the dielectric layer 16b, and the second capacitance electrode 16c in a planar manner, that is, is preferably provided in a position which overlaps with the capacitance element 16 in a planar manner, in particular, in a portion which overlaps with the first capacitance electrode 16a in a planar manner. Due to this, it is possible to secure the planar area of the capacitance element 16.

In addition, since the contact hole CNT8 is secured to be wide, it is possible to reliably perform the electric connection with the first capacitance electrode 16a and the pixel electrode 27. In addition, in other word, due to this, it is possible to improve the aperture ratio of the pixel P. In addition, it is preferable that the contact hole CNT8 be formed so as to overlap with a portion of any of the scanning line 3a, the gate electrode 30g, the data line 6a, or the capacitance line 3b. In addition, it is preferable that the contact hole CNT8 be provided in a position which does not overlap with the contact hole CNT4. It is possible to more reliably perform the electrical connection of the first capacitance electrode 16a and the pixel electrode 27 since there is no effect from steps due to the contact hole CNT4.

Next, the configuration of the pixel P will be described in further detail with reference to FIG. 7. As shown in FIG. 7, first, the scanning line 3a is formed on the first substrate 11. It is possible for the scanning line 3a to use, for example, a metal, an alloy, a metal silicide, a polysilicide, a nitride which includes at least one metal such as Al (aluminum), Ti (titanium), Cr (chromium), W (tungsten), Ta (tantalum), and Mo (molybdenum), or a laminate thereof and to block light.

A lower insulation film 11a, which is formed from, for example, silicon oxide or the like so as to cover the scanning line 3a, is formed and the semiconductor 30a is formed in an island shape on the lower insulation film 11a. The semiconductor layer 30a is, for example, formed from a polycrystal silicone film, and an LDD configuration, which has the data line side source and drain region 30s, the jointing region 30e, the channel region 30c, the joining region 30f, and the pixel electrode side source and drain region 30d which are described above, is formed by inserting impurity ions.

A first insulation film (gate insulation film) 11b is formed so as to cover the semiconductor layer 30a. The two contact holes CNT5 and CNT6 are formed to penetrate through the lower insulation film 11a and the first insulation film 11b in a position which overlaps with the scanning line 3a. Furthermore, the gate electrode 30g is formed in a position which opposes the channel region 30c with the first insulation film 11b being interposed therebetween so as to fill in the two contact holes CNT5 and CNT6 and the gate electrode 30g is electrically connected to the scanning line 3a via the two contact holes CNT5 and CNT6.

A second insulation film 11c is formed so as to cover the gate electrode 30g and the first insulation film 11b and the two contact holes CNT1 and CNT2 are formed to penetrate through the first insulation film 11b and the second insulation film 11c in a position, which overlaps with the edge portions thereof, in the semiconductor layer 30a.

Then, the data line side source and drain electrode 51 and the data line 6a are formed to be linked with the data line side source and drain region 30s via the contact hole CNT1 by depositing a conductive film using a conductive material which blocks light such as Al (aluminum) so as to fill in the two contact holes CNT1 and CNT2 and cover the second insulation film 11c and by patterning the conductive film. At the same time, the pixel electrode side source and drain electrode 52 (the relay electrode 6b) is formed to be linked with the pixel electrode side source and drain region 30d via the contact hole CNT2.

Next, an interlayer insulation film 11d is formed by covering the data line 6a, the relay electrode 6b, and the second insulation film 11c. The interlayer insulation film 11d is formed from, for example, an oxide or a nitride of silicon and planarization processing is carried out so that the concavities and convexities in the surface, which occur due to the covering of the region where the TFT 30 is provided, are planarized. As a method for the planarization processing, for example, there are the examples of chemical mechanical polishing processing (CMP processing) and spin coat processing. After this, CNT3 is formed to penetrate through the interlayer insulation film 11d.

On the interlayer insulation film 11d which has been planarized, the relay electrode 3c and the capacitance line 3b are formed to be linked with the pixel electrode side source and drain region 30d via the contact hole CNT3 by depositing a conductive film using a conductive material which blocks light such as Al (aluminum) so as to fill in CNT3 and cover the interlayer insulation film 11d and by patterning the conductive film.

The capacitance line 3b has a laminate structure where an aluminum (Al) film is arranged at a lower layer and a titanium nitride (TiN) is arranged at an upper layer. The thickness of the aluminum film is, for example, 150 nm to 200 nm. The thickness of the titanium nitride film is, for example, 100 nm to 150 nm.

Next, an interlayer insulation film 11e is formed as the second insulation film by covering the capacitance line 3b and the relay electrode 6b. The interlayer insulation film 11e is formed from, for example, an oxide or a nitride of silicon. After this, CNT4 is formed to penetrate through the interlayer insulation film 11e. The thickness of the interlayer insulation film 11e is, for example, 400 nm.

On the interlayer insulation film 11e, the first capacitance electrode 16a which configures the capacitance element 16 is formed to be linked with the capacitance line 3b via the contact hole CNT4 by depositing a conductive film using a conductive material which blocks light such as Al (aluminum) so as to fill in CNT4 and cover the interlayer insulation film 11e and by patterning the conductive film.

The first capacitance electrode 16a is, for example, titanium nitride. The thickness of the first capacitance electrode 16a is, for example, 100 nm to 200 nm.

On the interlayer insulation film 11e, the dielectric layer 16b is deposited by covering the first capacitance electrode 16a. As the dielectric layer 16b, a single layer film such as silicon nitride film, hafnium oxide ($HfO_2$), alumina ($Al_2O_3$), and tantalum oxide ($Ta_2O_5$) or a multi-layer film where at least two types out of the single layer films are laminated may be used. In addition, the dielectric layer 16b may be patterned into a shape which covers the first capacitance electrode 16a. Then, the contact hole CNT7 which penetrates through the interlayer insulation film 11e is formed.

On the interlayer insulation film 11e, the second capacitance electrode 16c which configures the capacitance element 16 is formed to be linked with the relay electrode 3c (pixel electrode side source and drain region 30d) via the contact hole CNT7 by depositing a conductive film using a conductive material which blocks light such as Al (aluminum) so as to fill in CNT7 and cover the interlayer insulation film 11e and by patterning the conductive film. The second capacitance electrode 16c is configured by, for example, a laminate structure of aluminum (Al) and titanium nitride (TiN). The thickness of the second capacitance electrode 16c is, for example, 300 nm to 500 nm.

Here, since the second capacitance electrode 16c is formed so as to cover the first capacitance electrode 16a, it is possible to prevent the first capacitance electrode 16a being pattern together when the second capacitance electrode 16c is patterned.

As above, it is preferable that the capacitance line 3b is provided on the interlayer insulation film 11d which has been planarized. Due to this, it is possible to prevent an increase in the resistance of the capacitance line 3b. In addition, it is possible to more reliably perform depositing and processing of the first capacitance electrode 16a, the dielectric layer 16b, the second capacitance electrode 16c, and the interlayer insulation film 11e which are formed afterwards.

Next, the interlayer insulation film 11f as the first insulation film is formed to cover the second capacitance electrode 16c and the like. The interlayer insulation film 11f is also formed from, for example, an oxide or a nitride of silicon and planarization processing may be carried out in the same manner as the interlayer insulation film 11e.

The contact hole CNT8 which penetrates through the interlayer insulation film 11f is formed in a position which overlaps with an edge portion of the second capacitance electrode 16c and a transparent conductive film such as ITO is deposited so as to fill in the contact hole CNT8. The pixel electrode 27 is formed to be linked with the second capacitance electrode 16c via the contact hole CNT8 by the transparent conductive film being patterned.

As described above, the second capacitance electrode 16c is electrically connected to the pixel electrode side source and drain region 30d of the TFT 30 via the contact hole CNT7, the relay electrode 3c, the contact hole CNT3, the relay electrode 6b, and the contact hole CNT2 and is electrically connected to the pixel electrode 27 via the contact hole CNT8.

In addition, it is preferable that the position of the contact hole CNT8 be provided in a position which does not overlap with the contact hole CNT4 in a planar view. By doing this, it is possible to more reliably perform the electrical connection of the second capacitance electrode 16c and the pixel electrode 27 due to the contact hole CNT8. Due to this, it is possible to suppress the effect due to steps of the contact hole CNT4 at the pixel electrode 27. In addition, since there are no steps due to the contact hole CNT4, it is possible to reliably perform processing of the contact hole CNT8.

In addition, since the capacitance element 16 is provided at the intersection portion of the scanning line 3a and the data line 6a, and in addition, the capacitance element 16 is provided in a region which overlaps with the transistor 30 in a planar view, it is possible to provide the capacitance element 16 which blocks light using the non-open region and it is possible to suppress a reduction in the aperture ratio.

Configuration of Electronic Apparatus

Figure 8:
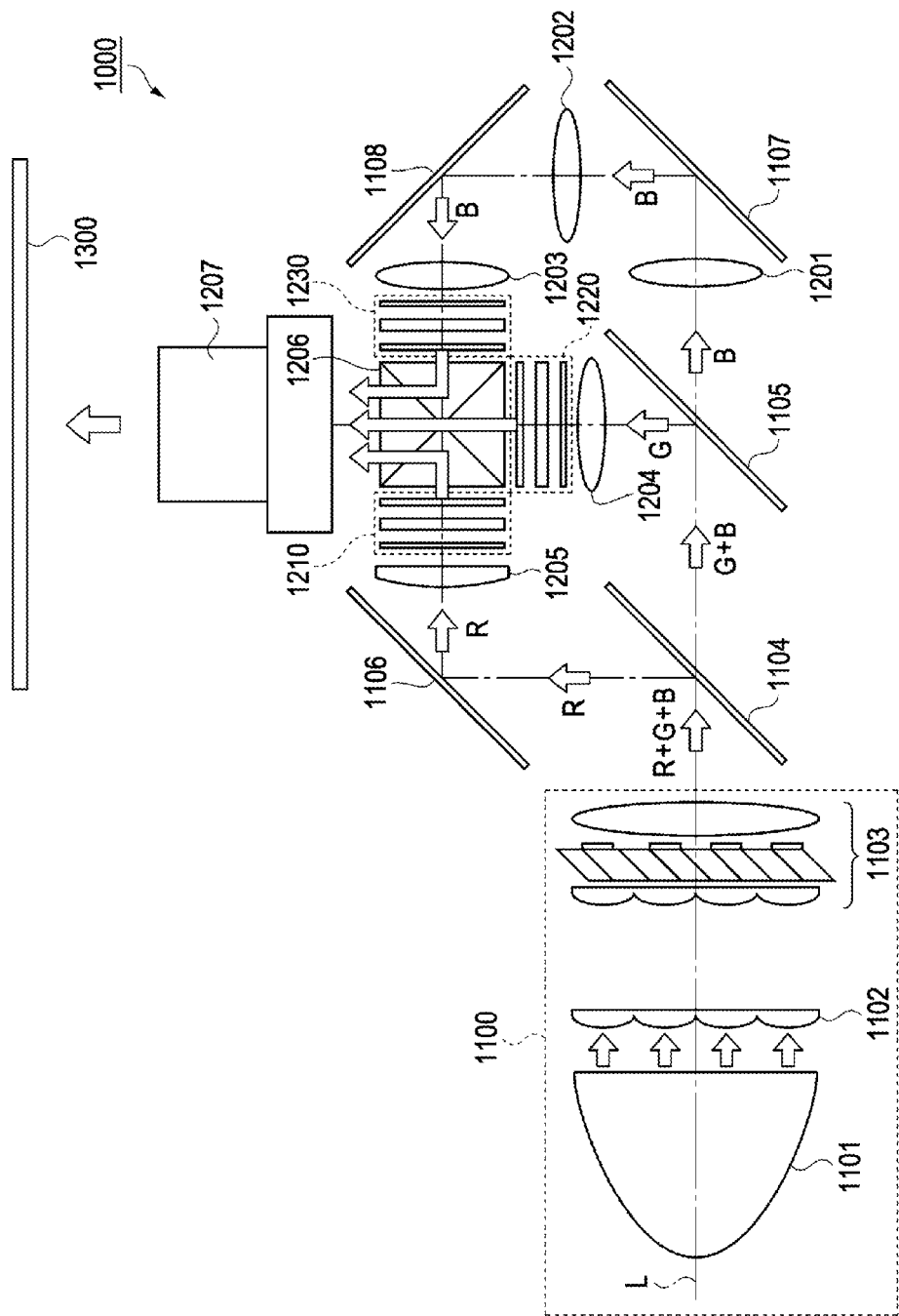
FIG. 8 is a schematic view illustrating a configuration of an electronic apparatus (projector) which is provided with the liquid crystal device.

FIG. 8 is a schematic view illustrating a configuration of a projection type display device as the electronic apparatus which is provided with the liquid crystal device. Below, the configuration of a projection type display device which is provided with the liquid crystal device will be described with reference to FIG. 8.

As shown in FIG. 8, a projection type display device 1000 as the electronic apparatus of the invention is provided with a polarization illumination device 1100 which is arranged along a system optical axis L, two dichroic mirrors 1104 and 1105 as light separating elements, three reflection mirrors 1106, 1107, and 1108, five relay lenses 1201, 1202, 1203, 1204, and 1205, three transparent liquid crystal light valves 1210, 1220, and 1230 as optical modulation means, a cross dichroic prism 1206 as a photosynthesis element, and a projection lens 1207.

The polarization illumination device 1100 is substantially configured from a lamp unit 1101 as a light source which is formed from a white light source such as an ultra-high pressure mercury lamp or a halogen lamp, an integrator lens 1102, and a polarization conversion element 1103.

The dichroic mirror 1104 reflects red light (R) out of the polarized light fluxes which are emitted from the polarization illumination device 1100 and transmits green light (G) and blue light (B). The other dichroic mirror 1105 reflects the green light (G) which is transmitted by the dichroic mirror 1104 and transmits blue light (B).

The red light (R) which is reflected by the dichroic mirror 1104 passes through the relay lens 1205 after being reflected by the reflection mirror 1106 and is incident on the liquid crystal light valve 1210. The green light (G) which is reflected by the dichroic mirror 1105 passes through the relay lens 1204 and is incident on the liquid crystal light valve 1220. The blue light (B) which pass through the dichroic mirror 1105 passes through a light guiding system formed from the three relay lens 1201, 1202, and 1203 and the two reflection mirrors 1107 and 1108 and is incident on the liquid crystal light valve 1230.

The liquid crystal light valves 1210, 1220, and 1230 are respectively arranged to be opposed with regard to the incidence surface for each of the colors of light in the cross dichroic prism 1206. The colored light which is incident on the liquid crystal light valves 1210, 1220, and 1230 are modulated based on the video information (video signal) and are emitted toward the cross dichroic prism 1206. The prism is where four right-angled prisms are combined and a dielectric multi-layer film which reflects red light and a dielectric multi-layer film which reflects blue light are formed in a cross shape in an inner surface thereof. The three colors of light are synthesized by the dielectric multi-layer films and the light which expresses a color image is synthesized. The light which has been synthesized is projected onto a screen 1300 using the projection lens 1207 which is a projection optical system and the image is formed by being enlarged.

The liquid crystal light valve 1210 is the application of the liquid crystal device 100 described above. The liquid crystal device 100 is arranged with a gap between the pair of polarization elements which are arranged in a cross Nicol shape in the incident side and the emission side of the colored light. The other liquid crystal light valves 1220 and 1230 are the same.

According to the projection type display device 1000, it is possible to provide an electronic apparatus where the display quality is improved by it being possible to secure sufficient holding capacitance due to the mediation of the liquid crystal module where the liquid crystal device 100 described above is adopted.

As is described above in detail, according to the liquid crystal device 100 as the electro-optical device of the present embodiment and the electronic apparatus, the following effects can be obtained.

(1) According to the liquid crystal device 100 of the present embodiment, since the first capacitance electrode 16a is arranged to cover (overlap with) the dielectric layer 16b and the second capacitance electrode 16c, it is possible for the area where the first capacitance electrode 16a overlaps with the dielectric layer 16b and the second capacitance electrode 16c to be large compared with a case where the dielectric layer and the second capacitance electrode are arranged only on the first capacitance electrode as in the related art. In other words, it is possible for capacitance to be made even in a side wall of the first capacitance electrode 16a. That is, it is possible to use the thickness of the first capacitance electrode 16a. As such, it is possible to increase the capacitance of the capacitance element 16 more than in the related art. In addition, it is possible to effectively use the area of the capacitance electrodes 16a and 16c.

(2) According to the liquid crystal device 100 of the present embodiment, since the interlayer insulation film 11f is arranged between the pixel electrode 27, which is connected to the pixel electrode side source and drain region 30d, and the second capacitance electrode 16c, an arrangement is possible where the first capacitance electrode 16a is covered using the second capacitance electrode 16c even if the pixel electrode 27 and the second capacitance electrode 16c are connected via the contact hole CNT8. As such, it is possible to prevent the capacitance area of the capacitance element 16 from becoming small which occurs due to the contact hole CNT8 being avoided and to effectively use the area of the capacitance electrode 16c and it is possible to increase the capacitance of the capacitance element 16.

(3) According to the electronic apparatus of the present embodiment, since the liquid crystal device 100 is provided as described above, it is possible to secure sufficient holding capacitance and it is possible to provide an electronic apparatus which improves display quality.

Second Embodiment

Configuration of Electro-Optical Device

Figure 9:
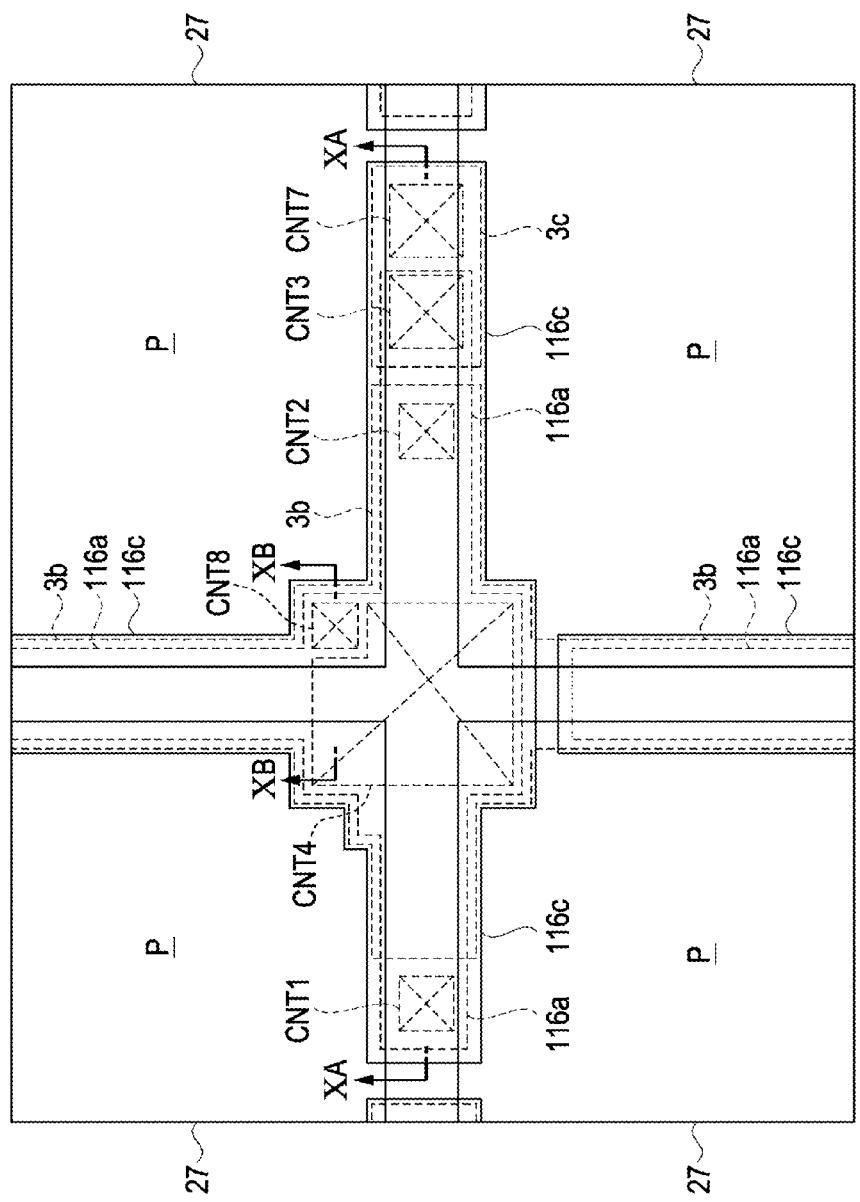
FIG. 9 is a schematic plan view illustrating a configuration of a liquid crystal device as an electro-optical device according to a second embodiment.

FIG. 9 is a schematic plan view illustrating a configuration of a liquid crystal device as an electro-optical device according to a second embodiment. FIG. 10 is a schematic cross-sectional view along a line X-X of the liquid crystal device of FIG. 9. Below, a planar structure and a cross-sectional structure of a pixel will be described with reference to FIGS. 9 and 10.

A liquid crystal device 200 of the second embodiment is different in the structure of the capacitance element 116 and is generally the same in the other configurations compared to the first embodiment described above. For this reason, in the second embodiment, differences with the first embodiment will be described while other same description thereof will be omitted.

As shown in FIGS. 9 and 10, in the liquid crystal device 200 of the second embodiment, the capacitance line 3b is provided to overlap with a portion of the data line 6a and a portion of the scanning line 3a in a planar manner, a capacitance element 116 is arranged in the non-open region (refer to FIG. 3), and a first capacitance electrode 116a, a dielectric layer 116b, and a second capacitance electrode 116c are laminated in order from the first substrate 11 side. The dielectric layer 116b is formed so as to cover the first capacitance electrode 116a. Furthermore, the second capacitance electrode 116c is formed so as to cover the first capacitance electrode 116a and the dielectric layer 116b.

Furthermore, the contact hole CNT4 which connects the first capacitance electrode 116a and the capacitance line 3b is provided in an L shape so as to overlap with a portion of the capacitance line 3b in a planar manner. In addition, in other words, the contact hole CNT4 has a cut out so as not to overlap with the contact hole CNT8 and an extension section of the first capacitance electrode 116a is provided. Since the extension section is provided, it is possible to form the contact hole CNT4 with an area with a wider width. In this manner, the capacitance element 16 has a shape which is a trench (groove). In addition, in other words, the capacitance element 16 has a portion along the side wall of the contact hole CNT4. In addition, in FIG. 9, the width of the contact hole CNT4 in the X direction is wider than the third portion of the first capacitance electrode 116a and the width of the contact hole CNT4 in the Y direction is wider than the first portion and the second portion of the first capacitance electrode 116a.

In addition, as shown in FIG. 10, the first capacitance electrode 116a, the dielectric layer 116b, and the second capacitance electrode 116c are formed in a shape which follows the contact hole CNT4 and the capacitance element 16 is formed in a three-dimensionally. Then, the first capacitance electrode 116a and the capacitance line 3b are formed at the bottom surface in the contact hole CNT4 of the first capacitance electrode 116a (refer to FIG. 10).

Here, it is preferable that the width of the contact hole CNT4 in a planar view is equal to or more than the thickness of the interlayer insulation layer 11e. If it is assumed that the contact hole CNT4 has a width which is different with regard to different distances, it is preferable that the shorter width be larger than the thickness of the interlayer insulation film 11e. The shorter width of the interlayer insulation film 11e is preferably 400 nm or more if the thickness of the interlayer insulation film 11e is, for example, 400 nm. It is preferable that the shorter width of the contact hole CNT4 is three time or more of the thickness of the first capacitance electrode 16a. For example, if the thickness of the first capacitance electrode 16a is 200 nm, it is preferable that the shorter width of the contact hole CNT4 is 600 nm or more. By doing this, the first capacitance electrode 16a is formed with a shape which follows the contact hole CNT4, the capacitance element 16 is formed also in the side wall of the contact hole CNT4, and it is possible to increase the capacitance of the capacitance electrode 16.

Furthermore, specifically, as shown in FIG. 10, in the interlayer insulation film 11e, a groove section (concave section) with substantially an L shape is formed which penetrates to the capacitance line 3b. On the interlayer insulation film 11e, the first capacitance electrode 116a is formed to be linked with the capacitance line 3b by depositing a conductive film using a conductive material which blocks light such as Al (aluminum) so as to fill in the groove and cover the interlayer insulation film 11e and by patterning the conductive film.

In addition, in the same manner as the first embodiment, the contact hole CNT8 which penetrates through the interlayer insulation film 11f is formed in a position in which the interlayer insulation film 11f overlaps with an edge portion of the second capacitance electrode 116c and a transparent conductive film such as ITO is deposited so as to fill in the contact hole CNT8. The pixel electrode 27 is formed to be linked with the second capacitance electrode 116c via the contact hole CNT8 by the transparent conductive film being patterned.

In this manner, since the connection of the first capacitance electrode 116a and the capacitance line 3b is a direct connection due to the first capacitance electrode 116a having a trench structure, it is possible for the circumference of the contacting portion to be longer compared with the first embodiment. Furthermore, it is also possible to increase the thickness of the first capacitance electrode 116a. Accordingly, it is possible to increase the capacity of the capacitance element 116. Due to this, it is possible for the capacitance of the capacitance element 116 to be secured even if the liquid crystal device 200 is extremely small.

As describe in detail above, according to the liquid crystal device 200 of the second embodiment, the effects shown below are able to be obtained.

(4) According to the liquid crystal device 200 of the second embodiment, it is possible to increase the area (circumference) and the thickness of the capacitance electrodes 116a and 116c and increasing the capacitance by increasing the size of the contact hole which electrically connects the first capacitance electrode 116a and the capacitance line 3b to substantially the same size as the size of the first capacitance electrode 116a (in other words, by increasing the size more than the other contact hole CNT8, and in addition, by directly connecting the first capacitance electrode 116a and the capacitance line 3b). In other words, by setting the first capacitance electrode 116a with a trench structure, it is possible to form a capacitance even in the side wall of the trench, and also possible to increase the capacity.

Here, the invention is not limited to the embodiments described above and appropriate modifications are possible which are in the range which does not depart from the gist or the concept of the invention as taken by reading from the scope of the claims and the specifications and are included in the technical scope of the invention. In addition, it is possible for the invention to be realized as the following embodiments.

Modification Example 1

As described above, two capacitance electrodes 16a and 16c which configure the capacitance element 16 is not limited to being configured by a metal layer (aluminum, titanium nitride, and the like) and may be configured by, for example, a transparent conductive film such as ITO.

Modification Example 2

As in the second embodiment described above, the shape of the first capacitance electrode 116a is not limited to an L shape, and for example, there may be other shapes if the area of the first capacitance electrode 116a is not excessively reduced. In addition, the circumference of the contact hole CNT4 may be a wave shape so that the circumference of the contact hole CNT4 is longer.

Modification Example 3

In the embodiments described above, the position of the contact hole CNT8 is provided in a position which does not overlap with the contact hole CNT4 in a planar view, but the position of the contact hole CNT8 may be a position which overlaps with the contact hole CNT4 in a planar view. Due to this, it is possible for the contact area of the contact hole CNT8 and the contact hole CNT4 to be widened.

Modification Example 4

As described above, it is possible for the electro-optical device such as the liquid crystal device 100 to be an active matrix type of electro-optical device which is provided with a transistor and to be applied also to display devices such as an organic EL (Electro Luminescence) device or an electrophoresis device. In addition, application to a reflective liquid crystal device (LCOS), a plasma display (PDP), a field emission display (FED, SED), and a digital micromirror device (DMD) is also possible.

Modification Example 5

As described above, the projection type display device 1000 (projector) has been described as an example of the electronic apparatus, but the electronic apparatus is not limited thereto, and for example, may be applied to a viewer, a view finder, a head mounted display, or the like. In addition, there may be application to various electronic apparatus such as a liquid crystal TV, a mobile phone, an electronic organizer, a word processor, a view finder type or a monitor direct view type video tape recorder, a workstation, mobile personal computer, a TV phone, a POS terminal, a pager, a calculator, or a touch panel, and in addition, an electrophoresis device such as electronic paper, a car navigation device, or the like.

The entire disclosure of Japanese Patent Application No. 2011-212174, filed Sep. 28, 2011 is expressly incorporated by reference herein.

What is claimed is:
1. An electro-optical device comprising:
   a transistor that has a gate electrode, a first source and drain region, and a second source and drain region;
   a scanning line that is electrically connected to the gate electrode;
   a data line that is electrically connected to the first source and drain region;
   a pixel electrode that is electrically connected to the second source and drain region; and
   a capacitance element that has a first capacitance electrode, a second capacitance electrode, a dielectric layer that is interposed between the first capacitance electrode and the second capacitance electrode, the first capacitance electrode being electrically connected to a capacitance line, the second capacitance electrode being disposed opposite to the first capacitance electrode,
   the first capacitance electrode being arranged so as to be covered with the dielectric layer and the second capacitance electrode, the first capacitance electrode being disposed between a first layer and a second layer, the first layer being one of a layer of the transistor, a layer of the scanning line, and a layer of the data line, the second layer being a layer of the pixel electrode.
2. The electro-optical device according to claim 1,
   a first insulation film being disposed between the second capacitance electrode and the pixel electrode, the second capacitance electrode and the pixel electrode being electrically connected via a first contact hole that is provided through the first insulation film, the first contact hole being arranged at a position overlapping the capacitance element when looking from a direction crossing to a surface of the pixel electrode.

3. The electro-optical device according to claim 1,
a second insulation film being disposed between the first capacitance electrode and the capacitance line,
the first capacitance electrode and the capacitance line being electrically connected via a second contact hole that is provided through the second insulation film.

4. The electro-optical device according to claim 3,
the first contact hole not overlapping with the second contact hole when looking from a direction crossing to a surface of the pixel electrode.

5. The electro-optical device according to claim 1,
the capacitance element being disposed corresponding to an intersection portion of the scanning line and the data line when looking from a direction crossing to a surface of the pixel electrode.

6. The electro-optical device according to claim 1,
the capacitance element being disposed in a position overlapping with the transistor when looking from a direction crossing to a surface of the pixel electrode.

7. An electronic apparatus comprising:
the electro-optical device according to claim 1.

8. An electronic apparatus comprising:
the electro-optical device according to claim 2.

9. An electronic apparatus comprising:
the electro-optical device according to claim 3.

10. An electronic apparatus comprising:
the electro-optical device according to claim 4.

11. An electronic apparatus comprising:
the electro-optical device according to claim 5.

12. An electronic apparatus comprising:
the electro-optical device according to claim 6.

13. The electro-optical device according to claim 1,
the layer of the transistor being one of a layer of the gate electrode and a layer of a semiconductor.

* * * * *